(12) United States Patent
Sortor

(10) Patent No.: US 6,765,469 B2
(45) Date of Patent: Jul. 20, 2004

(54) PRINTED CIRCUIT BOARD TRANSFORMER

(75) Inventor: John E. Sortor, Norristown, PA (US)

(73) Assignee: ENI Technology, Inc., Rochester, NY (US)

(*) Notice: Subject to any disclaimer, the term of this patent is extended or adjusted under 35 U.S.C. 154(b) by 0 days.

(21) Appl. No.: 10/080,252

(22) Filed: Feb. 21, 2002

(65) Prior Publication Data

US 2003/0156003 A1 Aug. 21, 2003

(51) Int. Cl.[7] .............................................. H01F 5/00
(52) U.S. Cl. .................... 336/200; 336/232; 336/223
(58) Field of Search ................................ 336/200, 223, 336/232

(56) References Cited

U.S. PATENT DOCUMENTS

| | | | |
|---|---|---|---|
| 3,990,024 A | 11/1976 | Hou |
| 4,376,274 A | 3/1983 | Smart |
| 5,003,622 A | 3/1991 | Ma et al. |
| 5,430,895 A | 7/1995 | Huusko |
| 5,777,539 A | 7/1998 | Folker et al. |
| 5,917,386 A | 6/1999 | Dobrovolny |
| 5,952,909 A | 9/1999 | Umeno et al. |
| 6,000,128 A | 12/1999 | Umeno et al. |
| 6,055,724 A | 5/2000 | Hishino et al. |
| 6,066,509 A | 5/2000 | Akram et al. |
| 6,175,727 B1 | 1/2001 | Mostov |
| 6,188,305 B1 | 2/2001 | Chang et al. |
| 6,194,243 B1 | 2/2001 | Akram et al. |
| 6,214,635 B1 | 4/2001 | Akram et al. |
| 6,376,918 B1 | 4/2002 | Akram et al. |

OTHER PUBLICATIONS

McMahill, "Microstrip Analysis/Synthesis Calculator, version 1.2.", 1997–2001, 5 pages, http://www.mit.edu/people/mcmahill/software/mstrip/mscalc,htm.
P.F. Williams, "Project List, EE494 Electrical Engineering Laboratory III," Jan. 1996. 10 pages, http://borges.uni.edu/assignments/F98ee494/projectlist.txt (note sections 8.1–8.3).
D. Jefferies, "Transmission Lines, "1996–2000, 10 pages, http://www.ee.surrey.ac.uk/Personal/D.Jefferies/transmission.html.
"Practical branch line coupler design for realizable branch impedance by using impedance/admittance inverter," date unknown (on or before Aug. 17, 2001) 9 pages, http://ee.tamu.edu/ysuh/branch2.pdf.

*Primary Examiner*—Anh Mai
(74) *Attorney, Agent, or Firm*—Harness, Dickey & Pierce, P.L.C.

(57) ABSTRACT

One configuration of the present invention is a radio frequency transformer board that has a planar dielectric substrate having a first surface, an opposite second surface, and a transformer. The transformer includes a first elongate conductor disposed on the first surface and having a first end and a second end, a second elongate conductor disposed on the second surface and having a first end and a second end. The first end of the first conductor and the second end of the second conductor are disposed proximate an edge of the substrate and spaced apart from one another along the edge. The second end of the first conductor and the first end of the second conductor are electrically shorted to one another proximate the edge of the substrate.

20 Claims, 15 Drawing Sheets

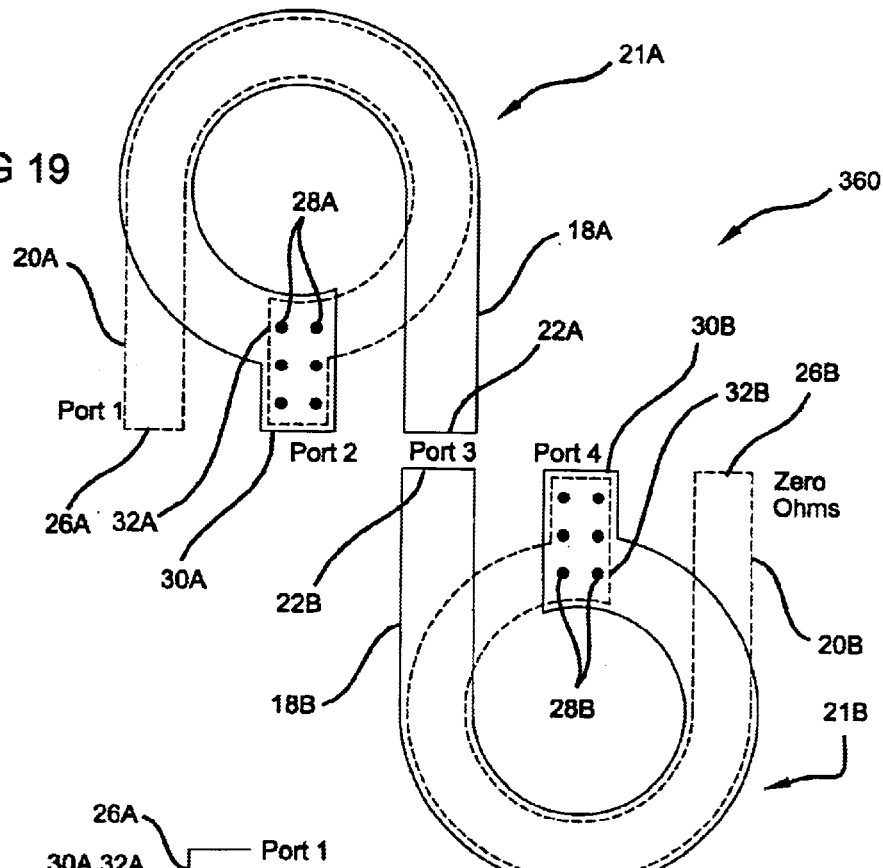
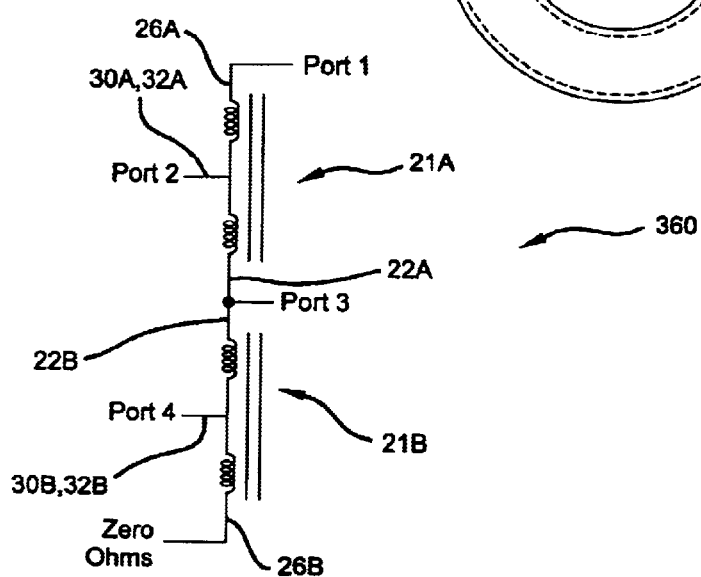

PRINTED CIRCUIT BOARD TRANSFORMER

FIELD OF THE INVENTION

The present invention relates to radio frequency circuits, and more particularly to impedance transformation systems for radio frequency circuits.

BACKGROUND OF THE INVENTION

Inherent problems associated with coaxial cables and twisted wire pairs limit the performance of transformers utilizing these components. More particularly, because of the limited number of coax impedances offered by cable manufacturers, only limited impedance transformations are possible. Also, RF currents flow through both the center conductor and shield of coaxial cable used in transformers. Because of its mechanical structure, the center conductor of the cable has more inductance per unit length than the shield. The additional inductance of the center conductor produces an undesirable phase lag between currents in the center conductor and the shield conductor.

The center conductor of a coaxial cable also has less surface area than the shield. In high power radio frequency (RF) applications, this difference in surface area leads to increased heating of the center conductor relative to the shield. Cooling of the center conductor is also hampered due to the surrounding dielectric, which acts as thermal insulation. In some applications, small diameter coaxial transmission line transformers are immersed in a low dielectric constant, non-conducting liquid to conduct heat away from the cable. This method works well, but requires a large, fluid-tight mechanical enclosure.

It is possible to reduce or eliminate this phase lag problem by cutting the transmission line cable in half and crisscrossing the center conductor and shield. Such configurations provide equal phase lag through each leg of the transformer, but the thermal problems described above may still arise.

Moreover, coaxial transmission line transformers are difficult to manufacture for use in VHF (30 to 300 MHz) and higher frequency applications. Assembly workers and standard coaxial cable stripping machines are not capable of preparing cable having the minimum lead lengths required at VHF and higher frequencies. Parallel (e.g., twisted pair) transmission line can be used, which also reduces the phase and thermal problems. However, most solid-state applications require a characteristic impedance of less than 50 ohms, and it is physically difficult to twist two wires together in such a way to attain such low impedances. Twisted pair transmission lines also have leakage problems at VHF and higher frequencies.

Microstrip transmission line can also be used to make RF transformers and baluns. A microstrip transmission line is a double-sided circuit board having a fixed ground plane on one side and a conductive trace on the other. The board between the ground plane and the conductive trace is made of a dielectric material. Parallel transmission lines must not be run in close proximity to any ground reference plane, so in amplifier circuits having horizontally-mounted microstrip transmission line transformers, heat sinks must be milled under the back side of the transformer to remove the ground reference. This type of construction increases cost and makes inspection after assembly impossible.

Transformers are also used in splitters and combiners for amplifier modules. In one known apparatus, for example, a plurality of 50-ohm amplifier modules are combined utilizing a tree of 2-way zero degree combiners or zero degree hybrids. The microwave equivalent of such a combiner or hybrid is widely known as the "Magic T." This component has two input ports having impedance $Z_0$, each having exactly the same phase (i.e., zero degree delta). A common or sum port has an impedance of $Z_0/2$ ohms. An isolated resistor of $Z0*2$ ohms connects the two input ports. It is possible to split and combine 2, 4, 8, 16 . . . $2^n$ fifty-ohm modules utilizing this topology.

A common problem when utilizing high power resistors is the unwanted distributed shunt C effect of the body of the resistor against the ground plane. This parasitic shunt C results in increased through loss and unwanted heating of the combiner. A series L element is required on each resistor terminal to cancel the shunt C. This element can be implemented using either lumped or distributed elements. Matching out the shunt C effect of the isolation resistor can yield very close to ideal through loss (<0.1 dB above theoretical) in a zero degree hybrid. However, the matching element may limit the bandwidth in some applications.

The circuit configuration of the zero degree hybrid is exactly the same as an unbalanced to unbalanced 4:1 autotransformer. This autotransformer is a 2-port device with an associated impedance transformation ratio and phase shift. The zero degree hybrid is a 3 port device with a zero degree difference between the two input ports. The impedance transformation ratio of the zero degree hybrid is 4:1, i.e., $(Z_{01}+Z_{02})/4$=impedance of sum port.

Common construction materials used to build a zero degree hybrid are coaxial transmission line and waveguide. In many high frequency applications, coaxial transmission line hybrids are subject to many or all of the problems listed above for coaxial transmission line transformers.

SUMMARY OF THE INVENTION

There is therefore provided, in one configuration of the present invention, a radio frequency transformer board that has a planar dielectric substrate having a first surface, an opposite second surface, and a transformer. The transformer includes a first elongate conductor disposed on the first surface and having a first end and a second end, a second elongate conductor disposed on the second surface and having a first end and a second end. The first end of the first conductor and the second end of the second conductor are disposed proximate an edge of the substrate and spaced apart from one another along the edge. The second end of the first conductor and the first end of the second conductor are electrically shorted to one another proximate the edge of the substrate.

In another configuration, a transformer assembly utilizing the above-described radio frequency transformer is utilized in a transformer assembly. The radio frequency transformer is mounted perpendicularly to a surface of a planar RF circuit board having a plurality of electrical contacts disposed thereon. The first end of the first elongate conductor of the radio frequency transformer, the second end of the second elongate conductor of the radio frequency transformer, and the electrically shorted second end of the first and the first end of the second conductor are electrically coupled to the electrical contacts.

Yet another configuration provides a radio frequency transformer board that has a planar dielectric substrate having a first surface, an opposite second surface, and a transformer. The transformer includes a first elongate conductor disposed on the first surface and having a first end and a second end, a second elongate conductor disposed on the second surface and having a first end and a second end. The first end of the first conductor and the second end of the first conductor are spaced apart from one another proximate an edge of the substrate. The first end of the second conductor and the second end of the second conductor are also spaced apart from one another at the edge of the substrate.

Configurations of the present invention provide RF transformations that avoid undesirable phase lags between conductors, and do not experience differential heating of conductors. Moreover, such configurations are more easily manufactured than twisted pair or coaxial transformers, and are easily replicated as printed circuits. In addition, compensation of distributed shunt C effects of resistors in combiners utilizing RF transformer configurations of the present invention is easily accomplished.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 19 is a plan view of one configuration of a 16:1 unbalanced to unbalanced transformer.

FIG. 20 is a schematic diagram representation of the transformer of FIG. 19.

In some of the Figures, edges that would otherwise be hidden from view are shown by hidden (i.e., dashed) lines.

DETAILED DESCRIPTION OF THE PREFERRED EMBODIMENT(S)

The following description of the preferred embodiment(s) is merely exemplary in nature and is in no way intended to limit the invention, its application, or uses.

Figure 1:
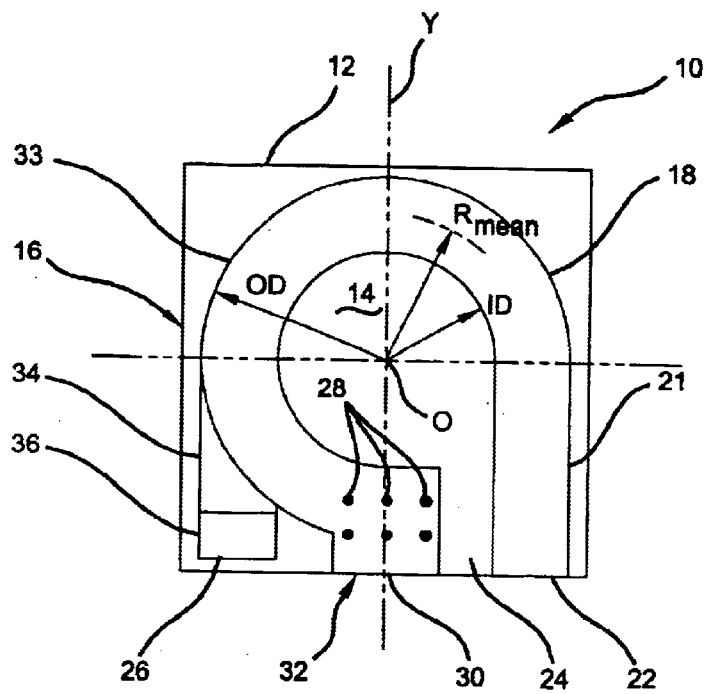
FIG. 1 is a drawing of one surface of a configuration of a radio frequency transformer board of the present invention.

In one configuration and referring to FIG. 1, a radio frequency (RF) transformer board 10 is provided that comprises a planar dielectric substrate 12 that has a first surface 14 and an opposite second surface 16. (Second surface 16 is indicated in FIG. 1, but would not be visible in the orientation shown. Second surface 16 would be visible if board 10 were rotated 180 degrees around axis Y.) A first elongate conductor 18 is disposed on first surface 14 of substrate 12. A second elongate conductor 20 (not shown in FIG. 1) is disposed on second surface 16 of substrate 12. For example, substrate 12 is a printed circuit board, and conductors 18 and 20 are conductive traces on opposite sides of the board.

A first end 22 of conductor 18 is disposed proximate an edge 24 of substrate 12. More particularly, first end 22 of conductor 18 is configured to electrically contact a conductor on a circuit board perpendicular to substrate 12 and contacting edge 24. Similarly, a second end 26 of conductor 20 is also disposed proximate edge 24 of substrate 12, but spaced apart from first end 22 of conductor 18 along edge 24 in the plane of substrate 12. In one configuration, one or more plated through holes ("via holes") 28 join second end 30 of first conductor 18 and first end 32 of second conductor 20. (Although not shown in FIG. 1, the locations of first end 26 and second end 32 of conductor 20 on second surface 16 are indicated.) One or more electrical shorts may be utilized for the same purpose as printed through holes 28. For example, a wire through a drilled hole that is soldered to ends 30 and 32 may be used, or a trace on a circuit board abutting edge 24 having fillets of solder electrically contacting ends 30 and 32 may be used. In this configuration, conductors 18 and 20 are conductors forming a transformer 21.

In one configuration, conductors 18 and 20 are the same shape. More particularly, if board 10 were rotated 180 degrees around axis Y, it would not be possible to distinguish surface 14 from surface 16 from inspection of the shapes of conductors 18 and 20. Also in one configuration, conductor 18 comprises an arc 33 having a mean radius $R_{mean}$, an outside diameter OD, and an inside diameter ID. Conductor 20 has a similar arc with the same dimensions. Both arcs are concentric about a center O, so that large portions of conductors 18 and 20 directly oppose one another on opposite sides 14 and 16 of substrate 12. In one configuration, transformer board 10 is utilized in a circuit operating at a frequency f and conductors 18 and 20 each have length λ/8, where λ is a wavelength at frequency f.

In one configuration, tuning segments are provided. In the embodiment illustrated in FIG. 1, two tuning segments 34 and 36 are provided for tuning first conductor 18. Additional tuning segments (not shown) are also provided for tuning second conductor 20. These may be electrically connected as required to their respective conductors 18, 20 to provide improved phase balance. For example, tuning segments 34 (or both 34 and 36) may be connected to first conductor 18 using wire or copper tape.

In one configuration, conductors 18 and 20 are equal width copper microstrip lines printed on opposite sides 14 and 16, respectively, of a printed circuit board 12. To ensure low loss, substrate 12 has a low dielectric constant. For example, in one configuration, substrate 12 is a DUROID® board (available from Rogers Corporation, Rogers, Conn.). A mean length (in wavelengths) of conductors 18 and 20 is determined by the desired transformation ratio. The characteristic impedance of conductors 18 and 20 is determined by the square root of the product of the low and high impedance ports. The characteristic impedance, the thickness of substrate 12, and the thickness of conductors 18 and 20 determine the width of conductors 18 and 20. Impedance transformation ratios of $n^2$:1 are readily obtained, where n is an integer. (As used herein, the terms "impedance ratio" and "transformation ratio" are both synonymous with the term "impedance transformation ratio.")

Figure 2:
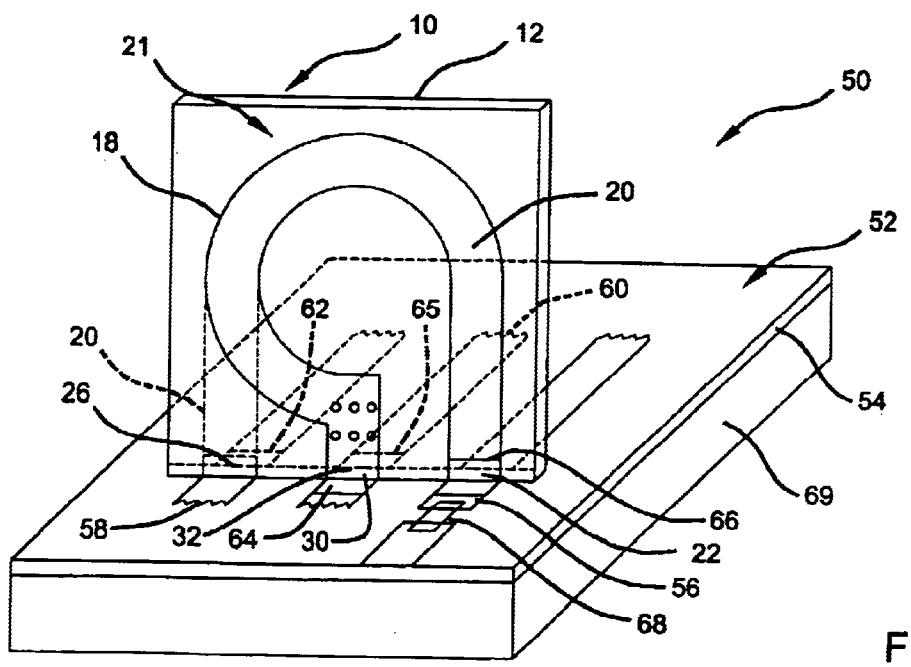
FIG. 2 is a perspective drawing of a configuration of a transformer assembly of the present invention in which some conductors and components are shown in phantom.
Figure 3:
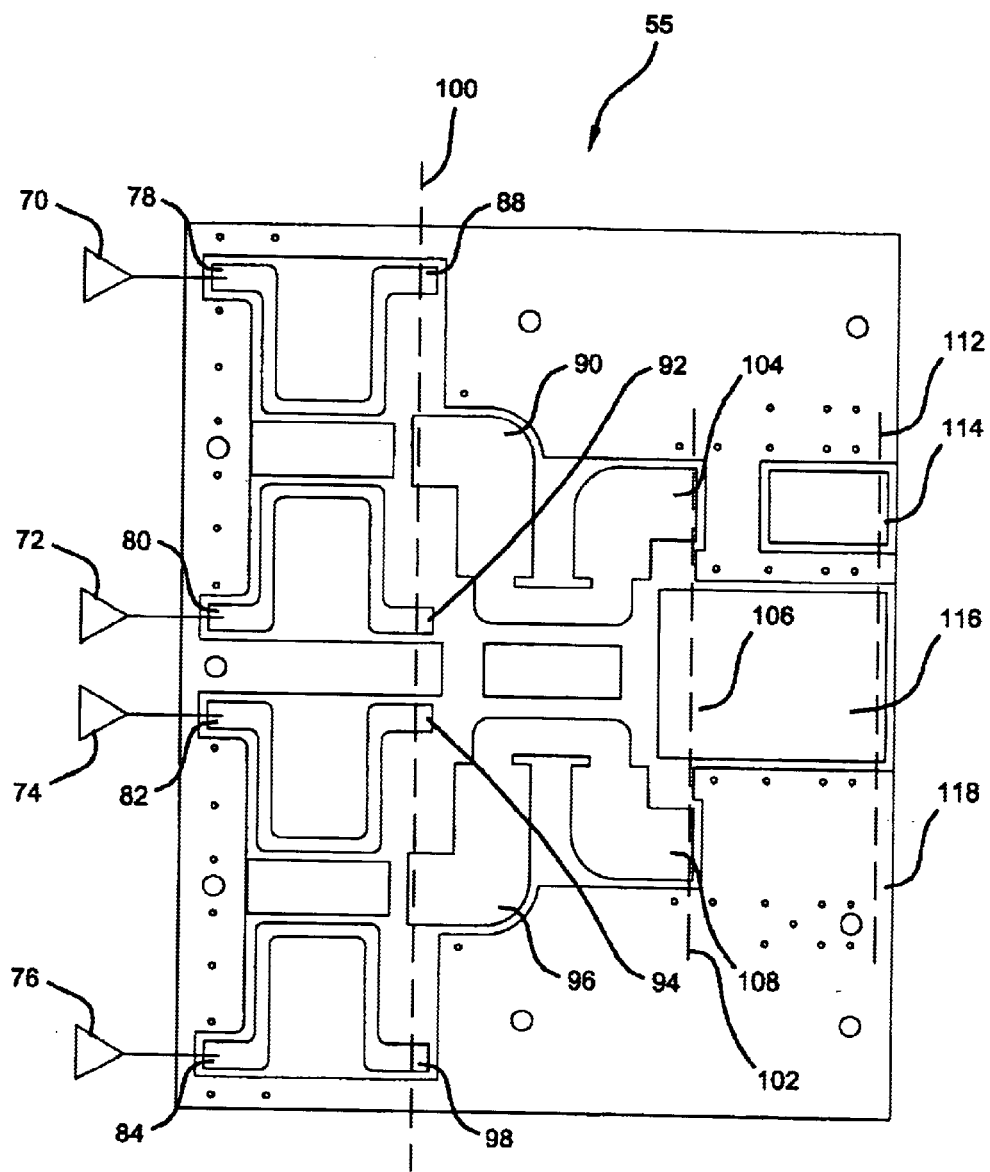
FIG. 3 is a drawing of one surface of a combiner board, showing positions at which radio frequency transformer boards are mounted perpendicular to the illustrated surface.
Figure 4:
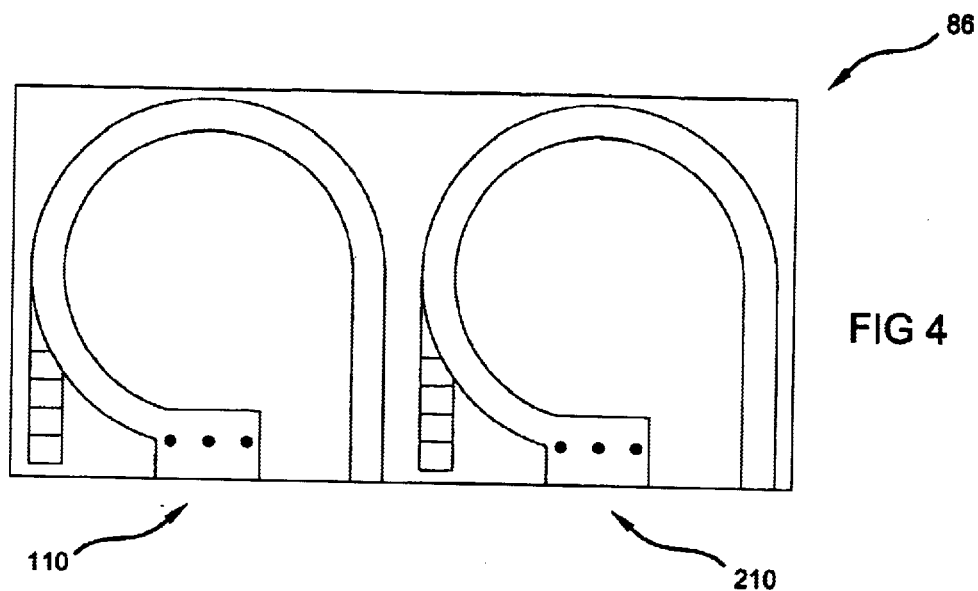
FIG. 4 is a drawing of one surface of a radio frequency transformer board having two transformers disposed thereon.

One configuration of a transformer assembly 50 comprising transformer board 10 is shown in FIG. 2. In this configuration, transformer board 10 is mounted perpendicularly to a surface 52 of a planar RF circuit board 54 having a plurality of electrical contacts 56, 58 and 60 disposed thereon. (Components shown completely or in part in phantom are either hidden from view by transformer board 10 or are printed on surface 16 of transformer board 10.) End 22 of conductor 18 is electrically connected to electrical contact 56. End 26 of conductor 20 is electrically connected to electrical contact 58. End 30 of conductor 18 and end 32 of conductor 20 are both electrically connected to electrical contact 60. Electrical connections in one configuration comprise solder fillets or right angle brackets 62, 64 and 66 soldered or welded to the conductors. Also in one configuration, electrical components such as capacitor 68 and amplifying transistors (not shown in FIG. 2) are mounted to circuit board 54 on the same side as transformer board 10. In this configuration, a heat sink may be connected at the bottom of circuit board 54, allowing the side having components such as capacitor 68 to be readily inspected In one configuration and referring to FIGS. 1, 3 and 4, circuit board 55 is a combiner board, as shown in FIG. 3. The 50-ohm outputs of four amplifiers 70, 72, 74, and 76, are connected to circuit board 55 at 78, 80, 82, and 84, respectively. (The side of circuit board 55 that is not shown comprises a conductive ground plane.) A board 86 having a pair of transformers 110 and 210 as shown in FIG. 4 (only one side of board 86 is shown) is vertically mounted on circuit board 55 (i.e., in a plane perpendicular to the paper) at 100 so that transformer 110 electrically connects to contacts 88, 90 and 92 and transformer 210 electrically connects to contacts 94, 96, and 98. Two separate transformer boards 10 each having a single transformer are also mounted vertically on circuit board 55. One board is mounted at 102 so that it electrically connects to contacts 104, 106 and 108. The other board is mounted at 112 so that it electrically connects to contacts 114, 116 and 118. In this manner, circuit board 55 combines a signal at four unbalanced 50-ohm inputs 78, 80, 82 and 84 into a single unbalanced output at 114.

Transformations listed in Table I are examples of those that may be obtained utilizing transformer configurations of the present invention. A configuration of each transformer is shown in the figures cited in each row of Table I. The "conductor length" column indicates the length in wavelengths of a single conductor on one side of a planar printed circuit board (PCB) substrate in wavelengths. The length of a first elongate conductor on each circuit board, measured curvilinearly from end to end and a second elongate conductor measured curvilinearly from end to end, is $$\frac{\lambda}{4n},$$

where λ is a wavelength at frequency f, $n^2$:1 is the impedance transformation ratio, and n is an integer. A second elongate conductor on the circuit board has the same length. In each configuration, conductors are printed on opposite sides of each PCB, and the number of PCBs in each configuration is indicated in the table. Transformations having impedance ratios of $n^2$:1 are possible, where n is an integer greater than or equal to one.

TABLE I

| Impedance Ratio | Configuration | lowZ ohms | highZ ohms | conductor length | lineZ ohms | no. of PCBs | See FIGS. |
|---|---|---|---|---|---|---|---|
| 1:1 | balance/unbalance | 50 | 50 | λ/4 | 50 | 1 | 6 and 7 |
| 4:1 | balance/balance | 12.5 | 50 | λ/8 | 25 | 2 | 9 and 10 |
| 4:1 | unbalance/unbalance | 12.5 | 50 | λ/8 | 25 | 1 | 11 and 12 |
| 9:1 | balance/balance | 5.56 | 50 | λ/12 | 16.6 | 2 | 13 and 14 |
| 9:1 | unbalance/unbalance | 5.56 | 50 | λ/12 | 16.6 | 2 | 15 and 16 |
| 16:1 | balance/balance | 3.12 | 50 | λ/16 | 12.5 | 4 | 17 and 18 |
| 16:1 | unbalance/unbalance | 3.12 | 50 | λ/16 | 12.5 | 2 | 19 and 20 |

Figure 6:
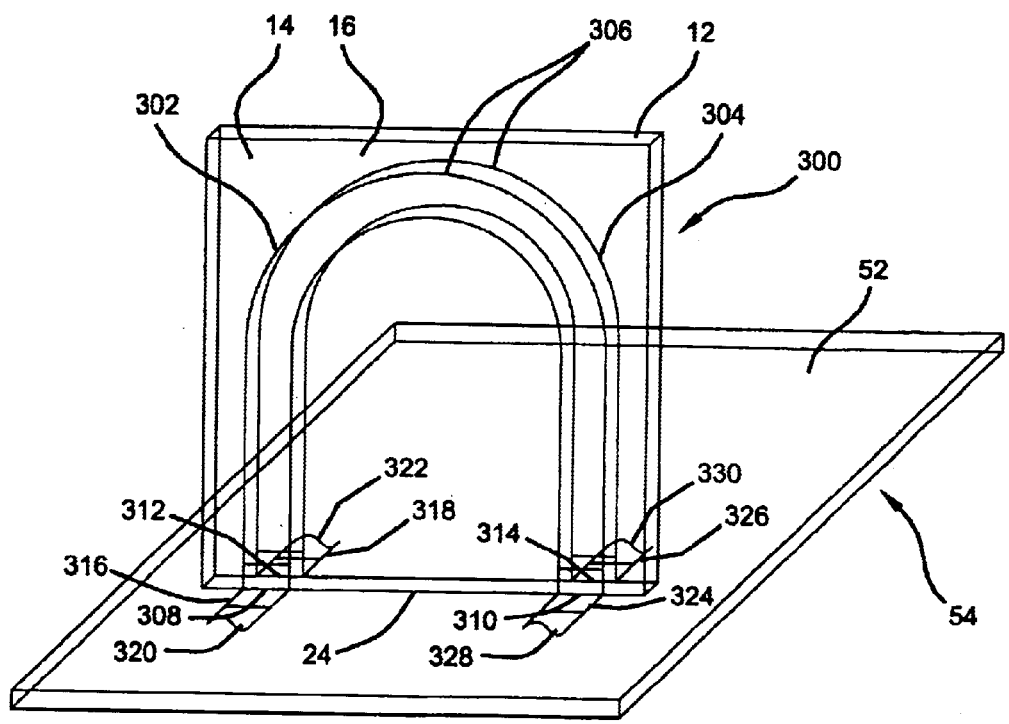
FIG. 6 is a pictorial view of one configuration of a 1:1 unbalanced to balanced transformer of the present invention.

In one configuration shown in FIG. 6, a radio frequency transformer board 300 includes a planar dielectric substrate 12 having a first surface 14, an opposite second surface 16, and a transformer 306. Transformer 306 includes a first elongate conductor 302 disposed on first surface 14. First elongate conductor 302 has a first end 308 and a second end 310 proximate an edge 24 (shown in FIG. 6 as the bottom edge) of planar dielectric substrate 12. A second elongate conductor 304 is disposed on second surface 16. Second elongate conductor 304 also has a first end 312 and a second end 314. First end 308 and second end 310 of first conductor 302 are spaced apart from one another along and proximate edge 24 of planar dielectric substrate 12. First end 312 and second end 314 of second conductor 304 are also spaced apart from one another along and proximate edge 24 of planar dielectric substrate 12. In addition, elongate conductors 302 and 304, as viewed from opposite sides of substrate 12, have essentially mirror-image shapes, and are printed or positioned so as to essentially coincide with one another on opposite sides 14 and 16 of substrate 12, thus forming a parallel transmission line.

FIG. 6 also shows one configuration for mounting transformer board 300 on an RF circuit board 54. A right angle bracket 316 is secured, for example, by solder, to end 308 of conductor 302 and to a conductor 320 on surface 52 of RF circuit board 54. Similarly, right angle bracket 318 is secured to end 312 of conductor 304 and to a conductor 322 on surface 52, right angle bracket 324 is secured to end 310 of conductor 302 and to a conductor 328 on surface 52, and right angle bracket 326 is secured to end 314 of conductor 304 and to a conductor 330 on surface 52 Right angle brackets 316, 318, 324, and 326 thus support transformer board 300 at right angles to surface 52 as well as provide a conductive electrical connection to conductors 320, 322, 328, and 330, respectively. Other electrical and physical connecting means, such as solder fillets, may be utilized in addition to, or in lieu of, right angle brackets 316, 318, 324, and 326.

In FIG. 6, neither conductor pair 320 and 322 nor 328 and 330 are joined under transformer board 300. However, the present invention does not prohibit such connections, if required by a circuit on RF board 54, nor does it prohibit providing plated through via holes in substrate 12 for such connections.

Figure 7:
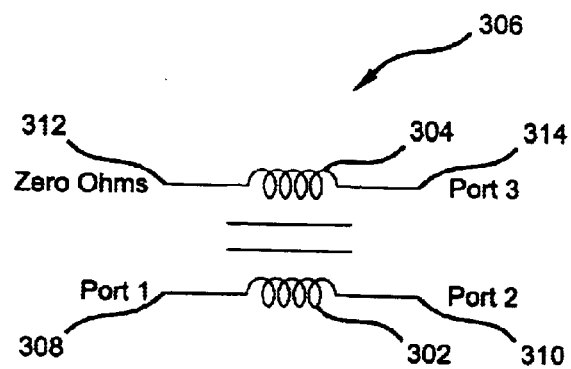
FIG. 7 is a schematic diagram representation of the transformer of FIG. 6

A schematic representation of transformer 306 is shown in FIG. 7. In general, no short circuits or plated through holes are used for transformer 306, although they may be provided if transformer 306 is utilized in a circuit in which it is advantageous to short circuit either end pairs 308 and 312 or 310 and 314. In a 1:1 unbalanced to balanced transformer such as that shown in FIGS. 7 and 8, the port 1 (308) unbalanced impedance is $Z_0$ ohms and the port 2 (310) to port 3 (314) balanced impedance is also $Z_0$ ohms. Zero ohms is at 312.

Figure 8:
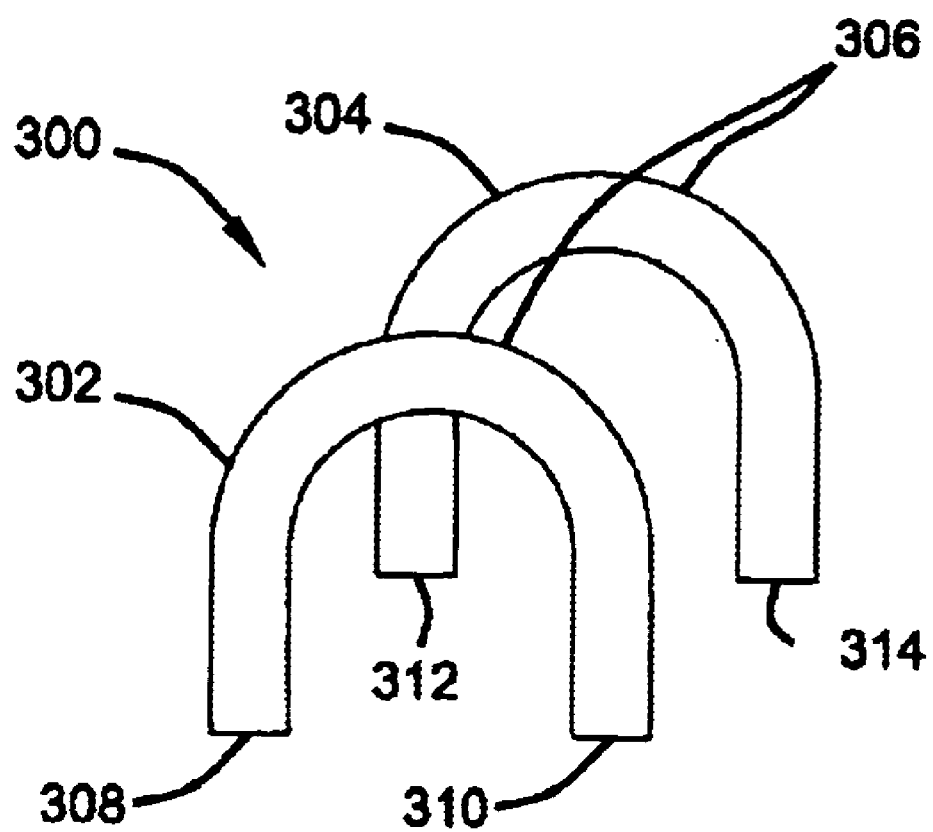
FIG. 8 is a simplified pictorial representation of a transformer board shown in FIG. 6. This simplified representation is utilized in FIGS. 9 and 17 in lieu of the more detailed representation shown in FIG. 6.
Figure 9:
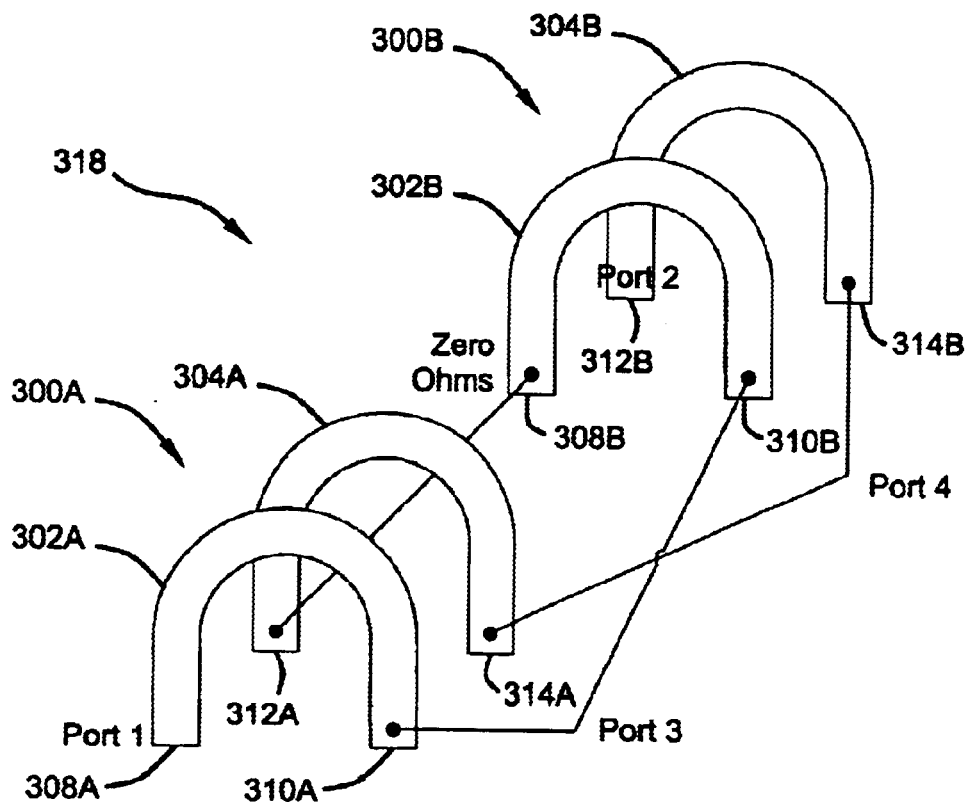
FIG. 9 is a pictorial view of one configuration of a 4:1 balanced to balanced transformer of the present invention.
Figure 10:
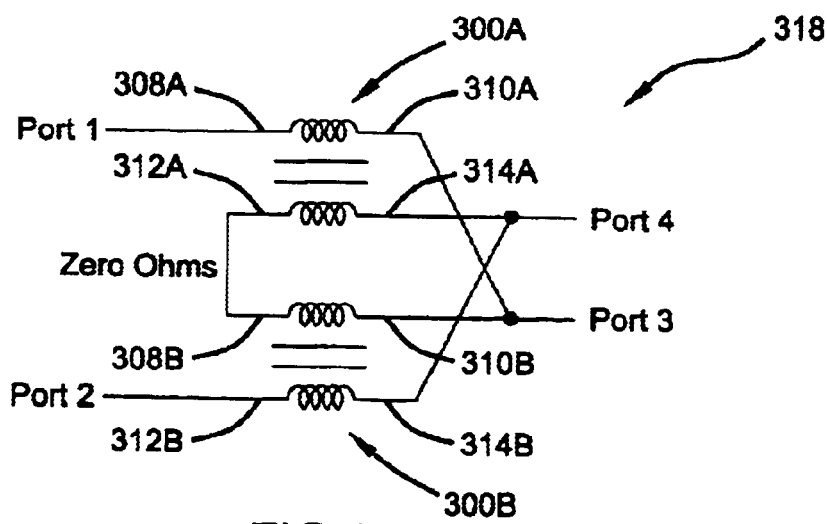
FIG. 10 is a schematic diagram representation of the transformer of FIG. 9.

The simplified pictorial representation of transformer board 300 shown in FIG. 8 is used in FIGS. 9 through 17 to simplify the drawings. Letter suffixes (e.g., 300A) are used to refer to individual transformer boards and portions thereof. Thus, in one configuration and referring to FIG. 9, a 4:1 balance/balance transformer 318 is obtained utilizing a pair of transformer boards 300A and 300B interconnected as shown in FIG. 9 and in the schematic diagram representation of FIG. 10. For example, in configuration, the interconnections are conductors on a surface 52 of an RF board similar to RF board 54 shown in FIG. 2. (Neither RF board 54 nor its surface 52 are shown in FIG. 9.) As indicated in Table I, the length of each conductor 302A, 304A, 302B, and 304B is λ/8 at an operating frequency f. The port 1 (308A) to port 2 (312B) balanced impedance is $Z_0$ ohms. The port 3 (310A) to port 4 (314B) balanced impedance is $Z_0/4$ ohms.

Figure 11:
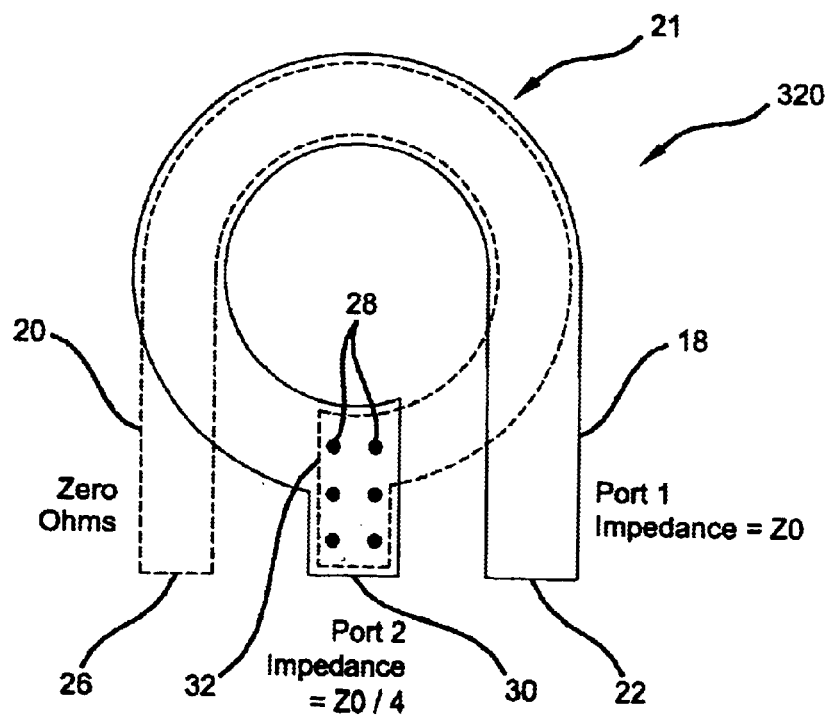
FIG. 11 is a plan view of one configuration of a 4:1 unbalanced to unbalanced transformer of the present invention.
Figure 12:
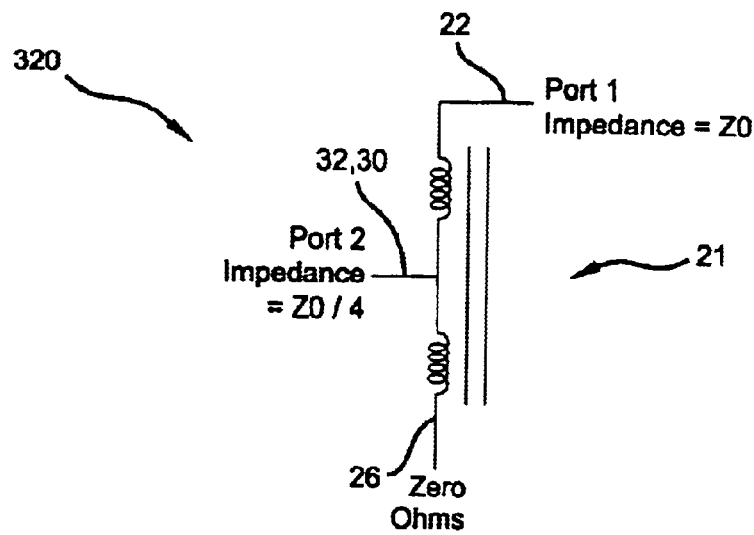
FIG. 12 is a schematic diagram representation of the transformer of FIG. 11.

In another configuration and referring to FIGS. 11 and 12, a 4:1 unbalance/unbalance transformer 320 is shown. Vias or plated through holes 28 interconnect ends 30 and 32 of transformer 21. (Although substrate 12 is not shown in FIG. 11, conductor 20 is represented by hidden or dashed lines because conductor 20 would be behind substrate 12, if substrate 12 were shown.) The port 1 (22) impedance is $Z_0$ ohms, and the port 2 (30 and 32) impedance is $Z_0/4$ ohms. Zero ohms is at 26.

Figure 13:
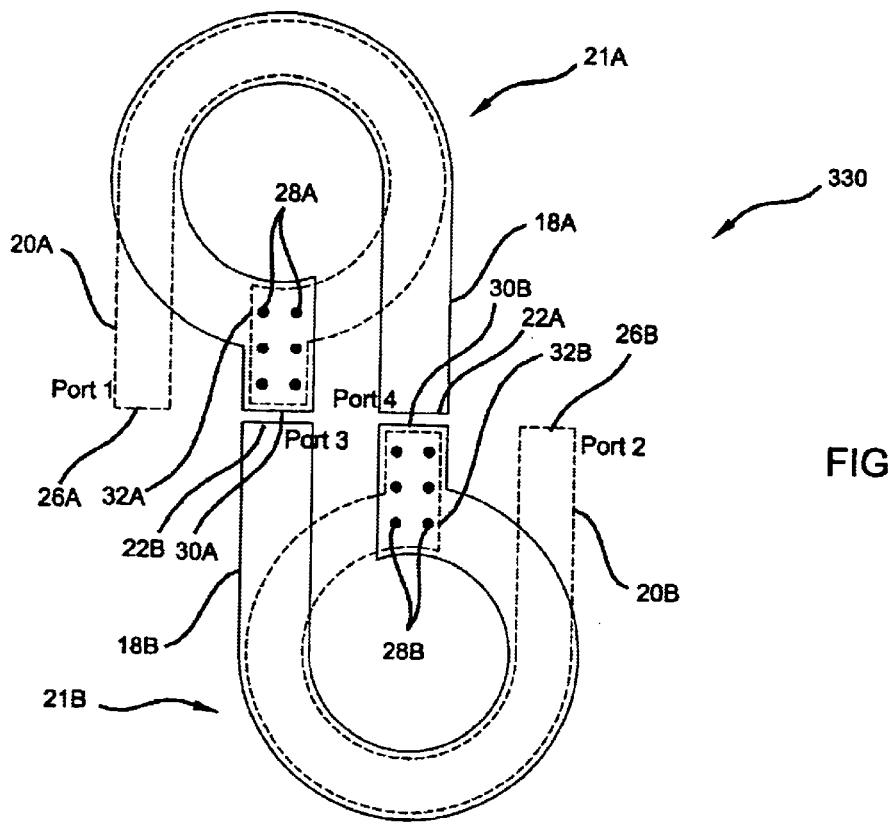
FIG. 13 is a plan view of one configuration of a 9:1 balanced to balanced transformed of the present invention.
Figure 14:
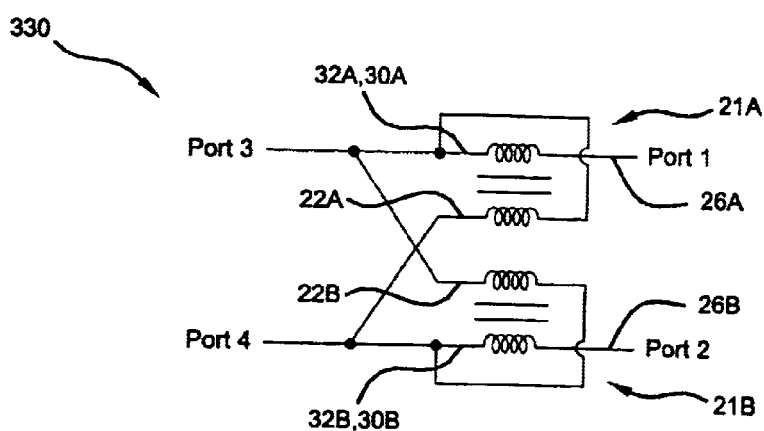
FIG. 14 is a schematic diagram representation of the transformer of FIG. 13.

In another configuration and referring to FIGS. 13 and 14, a 9:1 balance/balance transformer 330 is shown. This transformer comprises two transformer boards 21A and 21B interconnected as shown in FIG. 14. Conductors 18A, 20A, 18B, and 20B are each of length λ/12, as indicated in Table I. Plated through holes or vias 28A provide electrical shorting between ends 30A and 32A of transformer board 21A. Similarly, plated through holes or vias 28B provide electrical shorting between ends 30B and 32B of transformer board 21B. Ends 26A and 26B correspond to "port 1" and "port 2," respectively, in FIG. 14. "Port 3" corresponds to the interconnection of ends 30A, 32A, and 22B, and "port 4" corresponds to the interconnection of ends 30B, 32B, and 22A. Substrates for transformers 21A and 21B are not shown in FIG. 13. In addition, the interconnections between transformer boards 21A and 21B of are not shown in FIG. 13. However, boards 21A and 21B may be mounted on opposite surfaces of an RF circuit board 54, using conductors (for example, via holes or plated through holes) passing through RF circuit board 54. Both boards 21A and 21B may be mounted on the same side of RF circuit board 54, if positioned appropriately and if interconnections are provided on the mounting surface. The port 1 (26A) to port 2 (26B) balanced impedance is $Z_0$ ohms. The port 3 (30A and 32A) to port 4 (30B and 32B) balanced impedance is $Z_0/9$ ohms.

Figure 15:
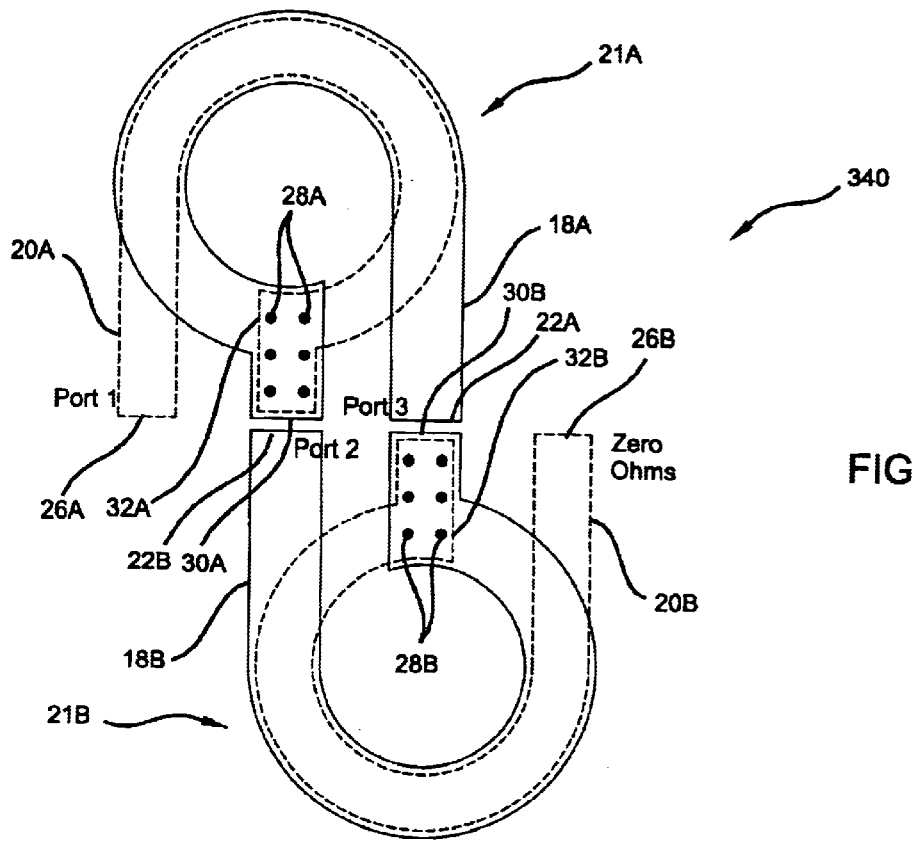
FIG. 15 is a plan view of one configuration of a 9:1 unbalanced to unbalanced transformer of the present invention.
Figure 16:
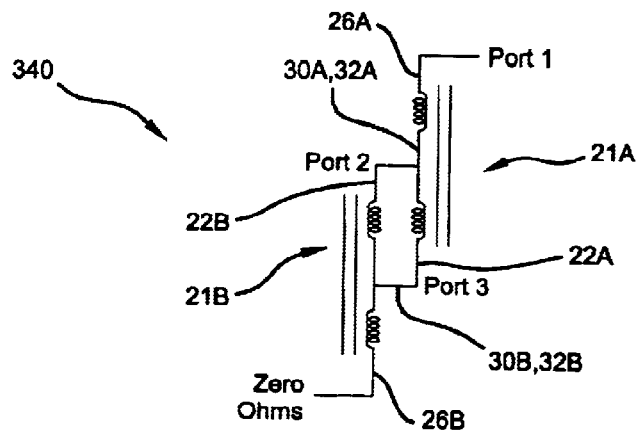
FIG. 16 is a schematic diagram representation of the transformer of FIG. 15

In one configuration and referring to FIGS. 15 and 16, a 9:1 unbalance/unbalance transformer 340 is shown. Transformer 340 is similar to transformer 330 except for the use of its connecting ports, as shown by FIG. 16. The port 1 (26A) impedance is $Z_0$ ohms. The port 2 (22B) impedance is $Z_0/2$ ohms. The port 3 (22A) impedance is $Z_0/9$ ohms. Zero ohms is at 26B.

Figure 17:
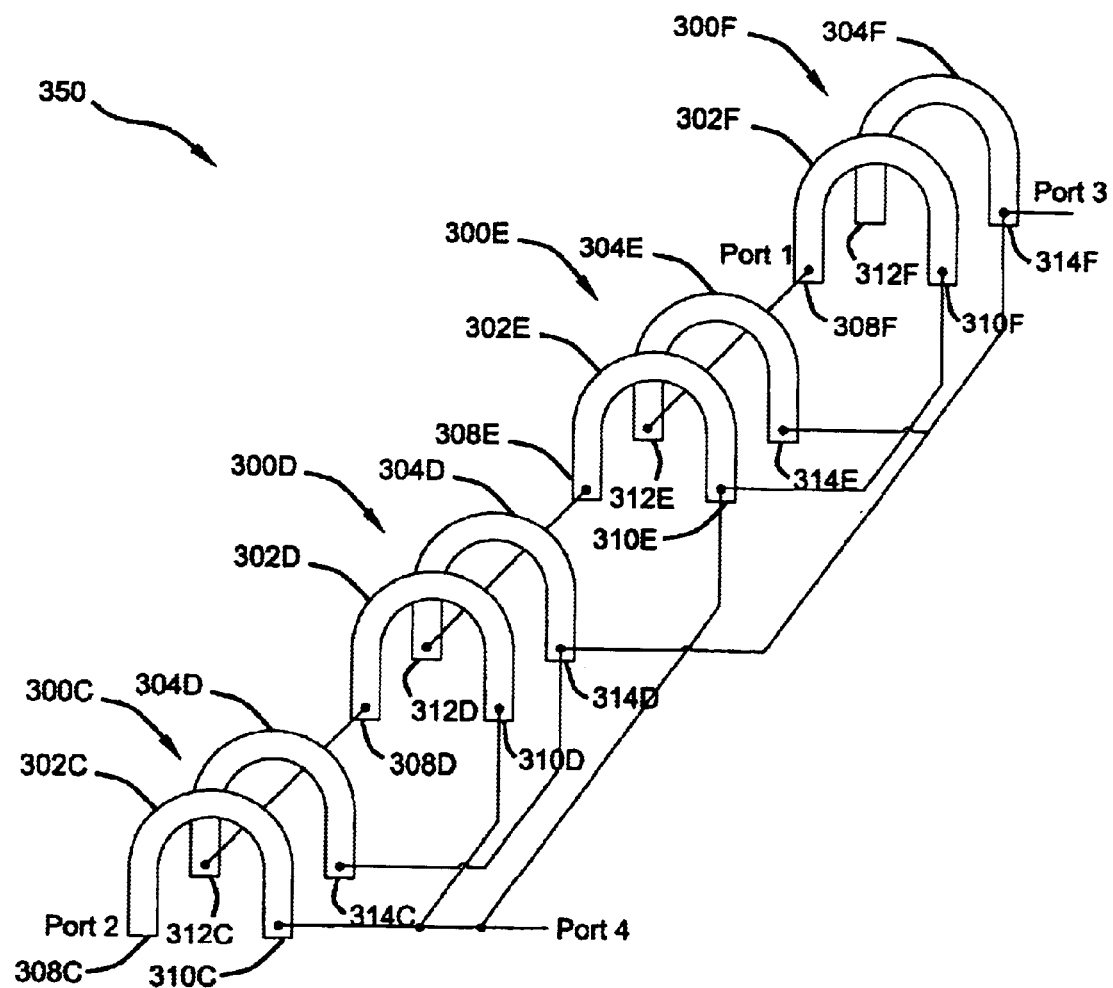
FIG. 17 is a pictorial view of one configuration of a 16:1 balanced to balanced transformer of the present invention.
Figure 18:
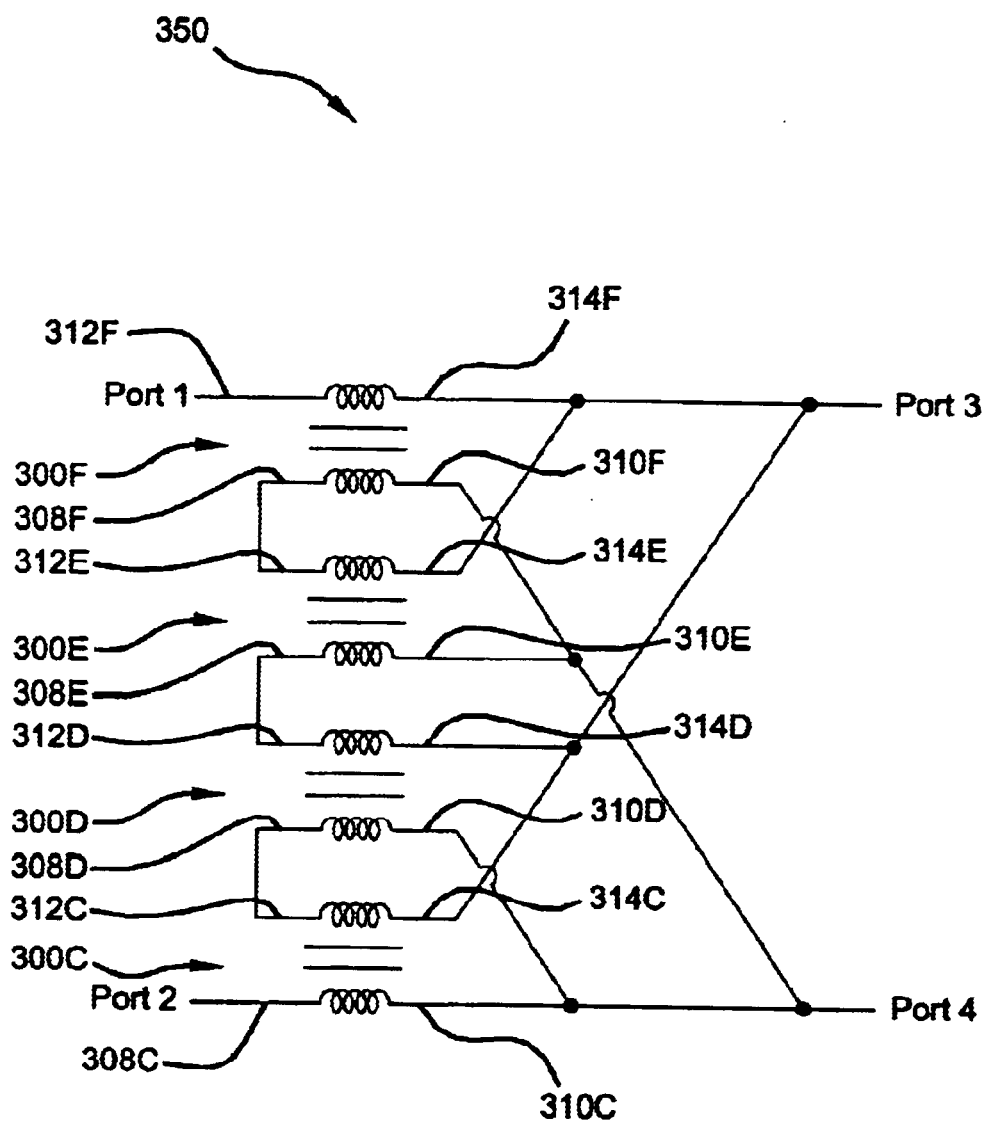
FIG. 18 is a schematic diagram representation of the transformer of FIG. 17.

In yet another configuration and referring to FIGS. 17 and 18, a 16:1 balance/balance transformer 350 is shown. This configuration utilizes four transformers 300C,. 300D, 300E, and 300F. Each conductor 302C, 304C, 302D, 304D, 302E, 304E, 302F, and 304F is λ/16 long at an operating frequency f. Ends 308C, 310C, 312C, 314C, 308D, 310D, 312D, 314D, 308E, 310E, 312E, 314E, 308F, 310F, 312F, and 314F are electrically interconnected as shown in FIGS. 17 and 18. Electrical interconnections in FIG. 17 are, for example, conductive circuits on an RF circuit board 54, not shown in FIG. 17. The port 1 (312F) to port 2 (308C) balanced impedance is $Z_0$ ohms. The port 3 (314F) to port 4 (310C) balanced impedance is $Z_0/16$ ohms.

In another configuration and referring to FIGS. 19 and 20, a 16:1 unbalance/unbalance transformer is shown. This transformer utilizes two transformer boards 21A and 21B in a manner similar to that shown in FIG. 15, but transformer boards 21A and 21B are interconnected differently. In addition, conductors 18A, 20A, 18B, and 20B are λ/16 in length at an operating frequency f. The port 1 (26A) impedance is $Z_0$ ohms. The port 2 (30A and 32A) impedance is $Z_0/3$ ohms. The port 3 (22A and 30B) impedance is $Z_0/4$. The port 4 (30B and 32B) impedance is $Z_0/16$. Zero ohms is at 26B.

Figure 21:
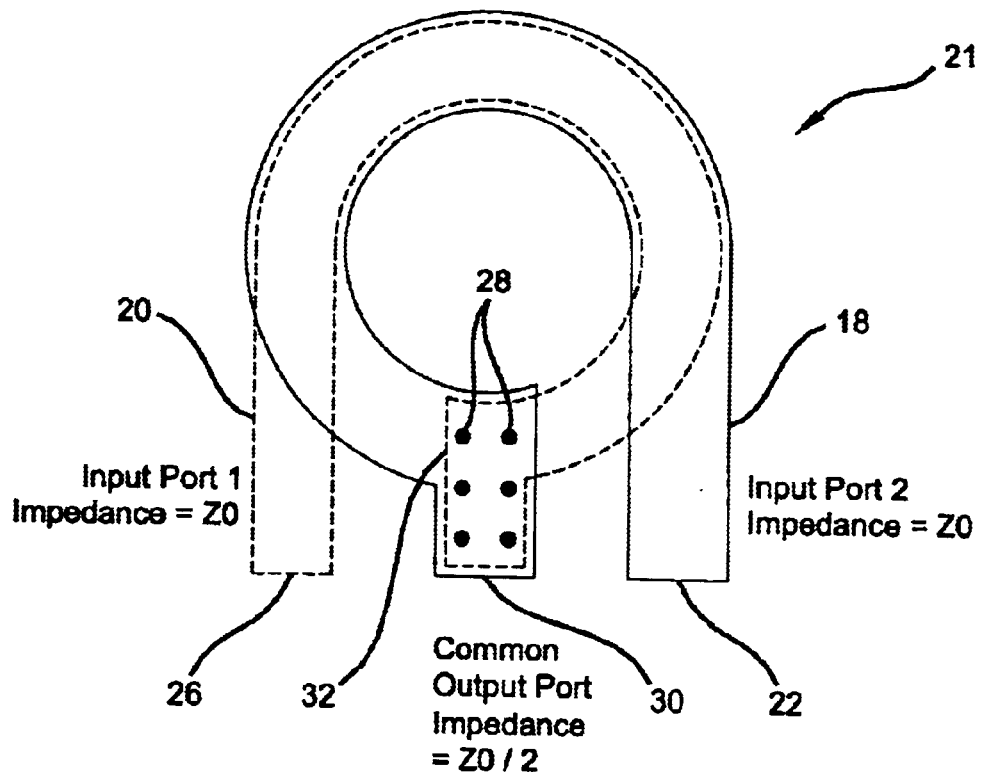
FIG. 21 is a plan view of one configuration of a zero degree hybrid of the present invention.
Figure 22:
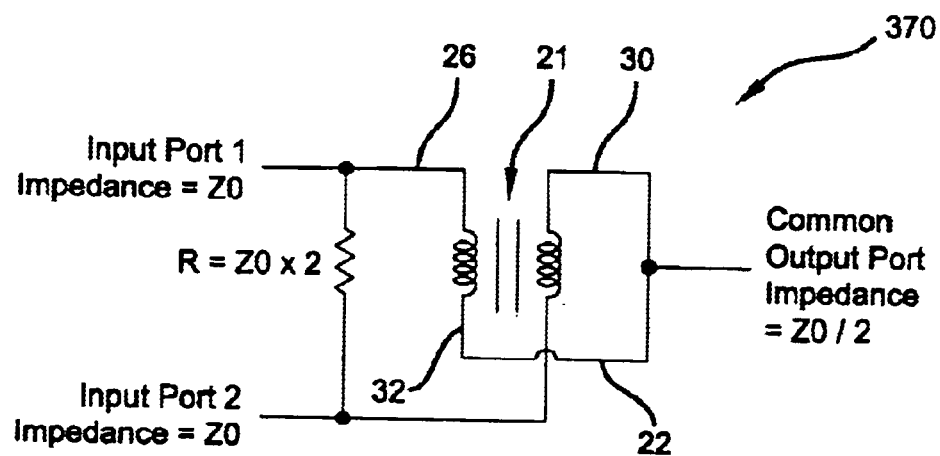
FIG. 22 is a schematic diagram representation of the zero degree hybrid of FIG. 21.
Figure 23:
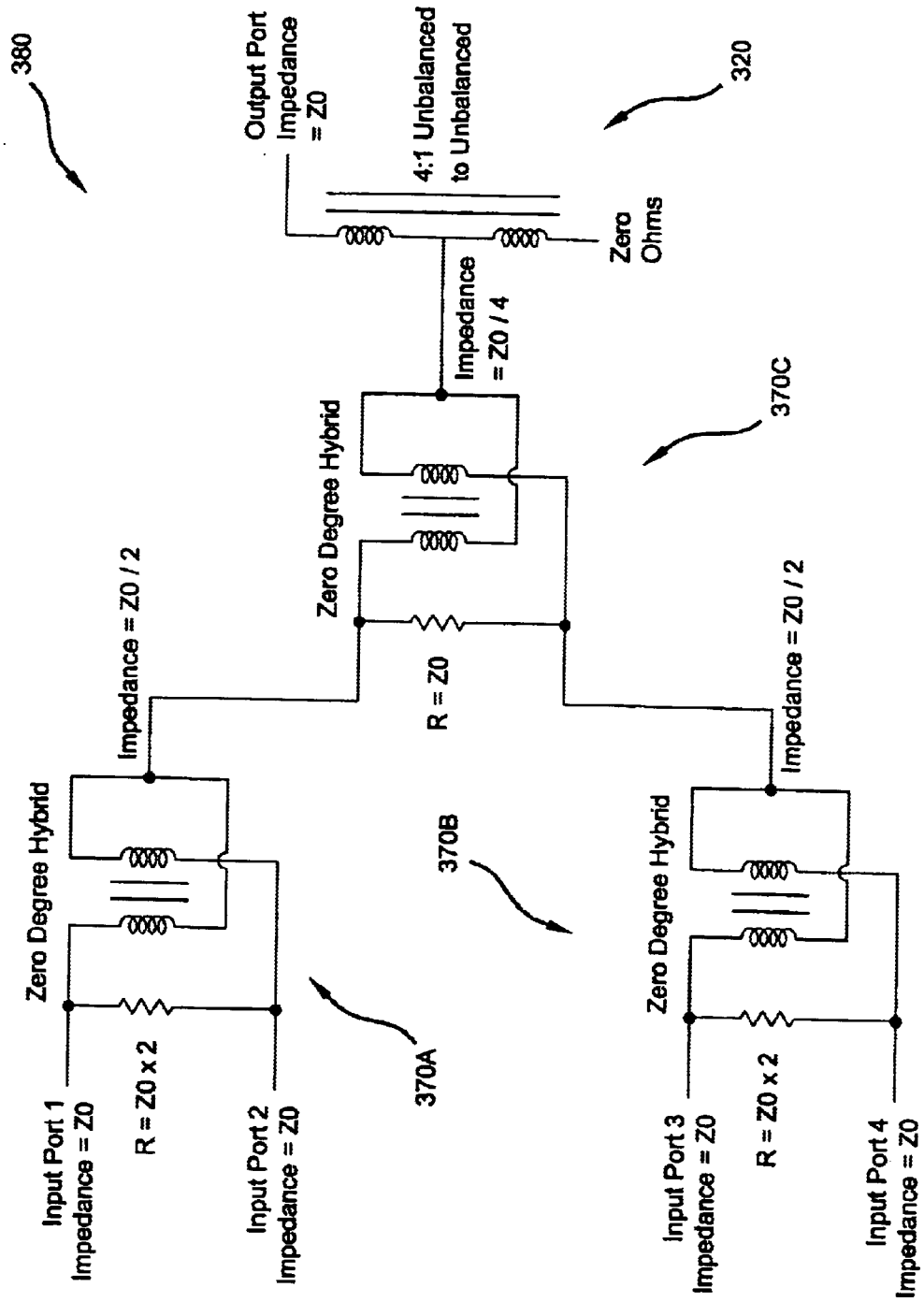
FIG. 23 is a schematic diagram representation of a configuration of a four-way power combiner of the present invention.

In yet another configuration, a splitter/combiner is provided. Transformations listed in Table II are representative of those that may be useful in such configurations. One configuration of a zero degree hybrid utilizes a transformer board 21 as shown in the plan view of FIG. 21 (which does not show substrate 12). A schematic of a splitter/hybrid 370 utilizing a transformer board 21 represented in FIG. 21 is shown in FIG. 22. Splitter/hybrid 370 utilizes a resistor R having an impedance Z0×2 between input port 1 and input port 2, each of which present an impedance Z0. A four-way power combiner 380 utilizing a plurality of zero degree hybrids 370A, 370B, and 370C is shown in the schematic diagram representation of FIG. 23, which also utilizes a 4:1 unbalance/unbalance hybrid 320. Note that zero degree hybrid 370C utilizes a resistor R=Z0 because of the impedances Z0/2 of the applied inputs.

TABLE II

| Imped. ratio | Configuration | input1 ohms | input2 ohms | sum ohms | conductor length | lineZ ohms | no. of PCBs |
|---|---|---|---|---|---|---|---|
| 4:1 | zero degree hybrid | 50 | 50 | 25 | λ/8 | 50 | 1 |
| 4:1 | zero degree hybrid | 25 | 25 | 12.5 | λ/8 | 25 | 1 |

A procedure for design of either transformers or zero degree hybrids is as follows:

A. Determine the substrate dielectric constant ($\epsilon_r$).
B. Determine the substrate thickness (h).
C. Determine the substrate velocity factor (v).
D. Determine the conductor thickness (cu).
E. Determine the transmission line impedance $Z_0 = (Z_{high} \times Z_{low})^{1/2}$.
F. Determine the parallel transmission line width (w) utilizing a standard microstrip model based on er, h, and cu.
G. Convert the center frequency electrical length (λ) to a mechanical length (L) utilizing the equation L (meters)= (300 (m/s)/freq (Hz))×λ×v.
H. Calculate a mean radius $R_{mean} = L/(2\pi)$.
I. Calculate an outside diameter OD=($R_{mean}$+w/2)×2.
J. Calculate an inside diameter ID=($R_{mean}$−w/2)×2.

For a splitter or combiner configuration, a 4:1 autotransformer is used to transform a sum port impedance of 12.5 ohms to 50 ohms.

Figure 5:
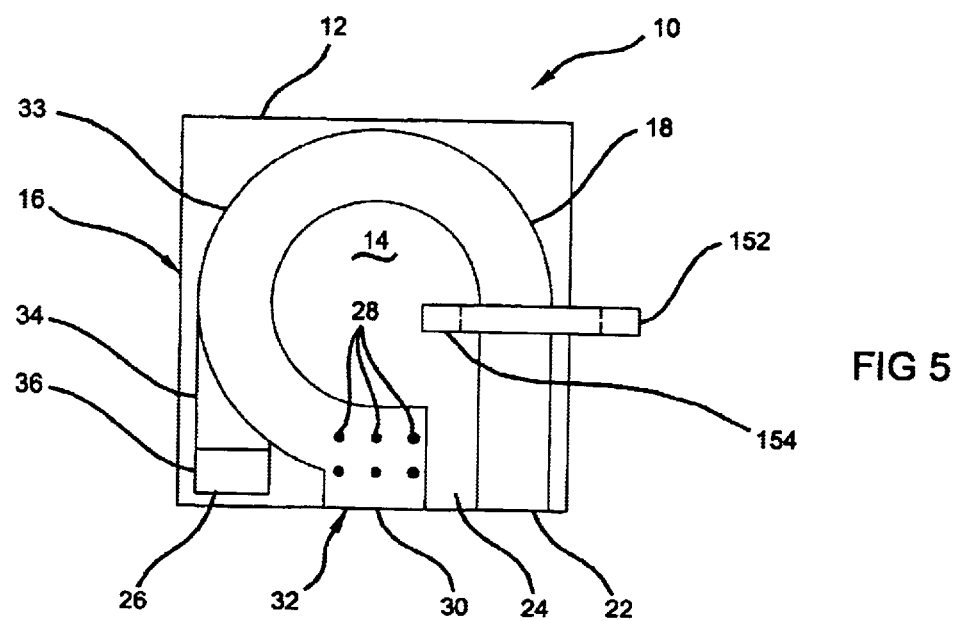
FIG. 5 is a plan view of one configuration of a radio frequency transformer board having a ferrite toroid surrounding the elongate conductors. The inner radius of the ferrite toroid is shown in phantom.

In some circuit configurations, greater operating bandwidth may be desired than can be obtained with the transformer board configurations described above. Therefore, in another transformer board configuration and referring to FIG. 5, a ferrite toroid 152 is secured (e.g., with epoxy) in a hole 154 of substrate 12. Ferrite toroid 152 surrounds conductors 18 and 20 and has the effect of increasing the electrical length of the transformer and thus the operable bandwidth of transformer board 10. Toroid 152 can be mounted in a hole 154 without requiring a slot cut to an edge of substrate 12 if toroid 152 comprises two C-shaped sections, or if toroid 152 has a slot through which substrate 12 can pass. In one configuration in which a slot is cut to an edge of substrate 12 to enable a standard toroid 152 to be utilized, copper tape and solder are used to rejoin the cut-apart sections of conductors 18 and/or 20.

Figure 24:
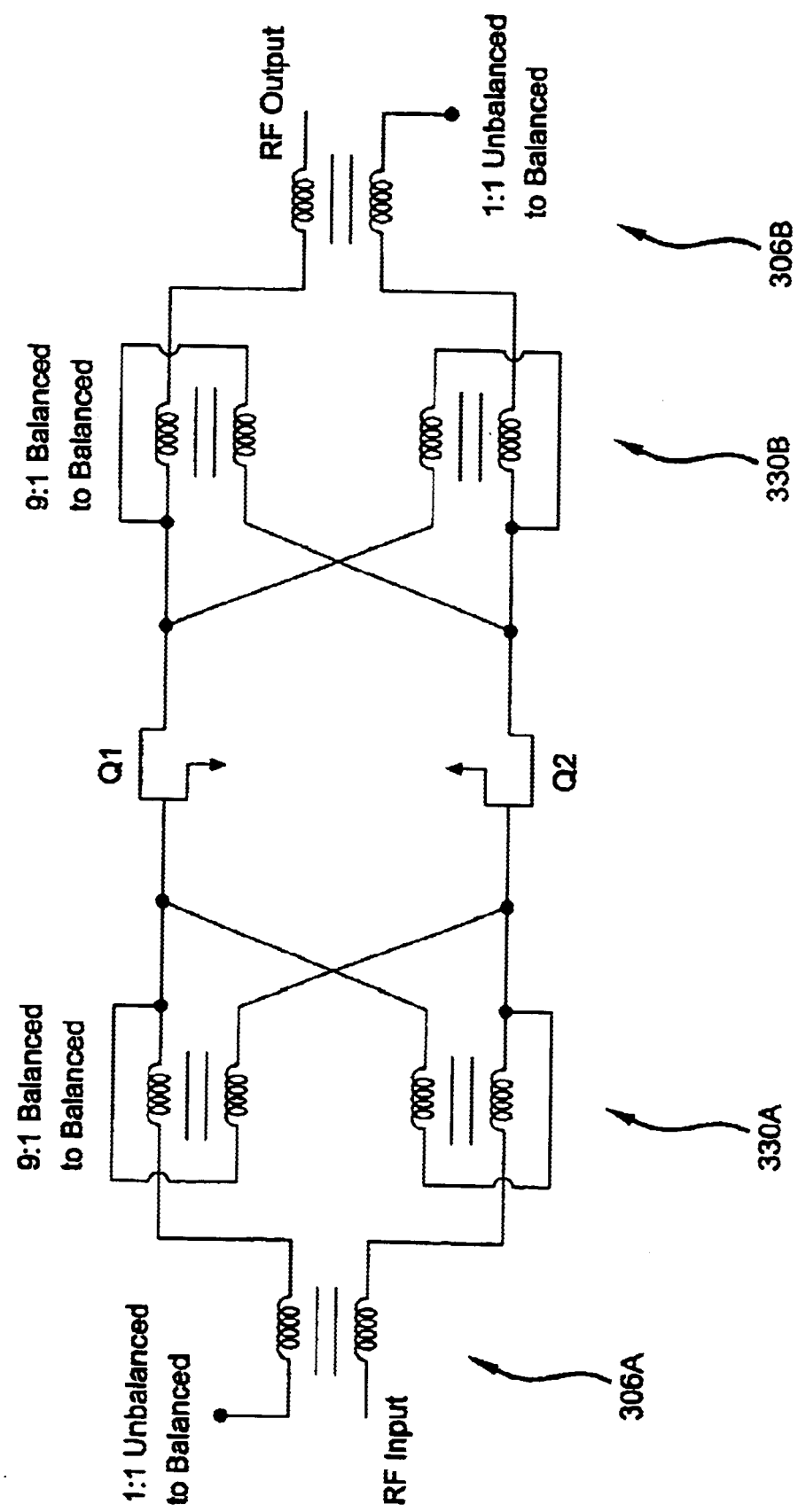
FIG. 24 is a schematic diagram representation of a configuration of a push-pull amplifier circuit of the present invention.

In one configuration of the present invention and referring to FIG. 24, a push-pull amplifier circuit is provided that utilizes a pair of transistors Q1 and Q2, two 1:1 unbalanced/balanced transformers 306A and 306B, and two 9:1 balance/balance transformers 330A and 330B.

Configurations of the present invention provide RF transformations that avoid undesirable phase lags between conductors, because the conductors in the transformers have similar or identical dimensions, unlike coaxial cable conductors. Because the conductors are physically similar and do not surround each other, they do not experience differential heating. Construction and repeatability of transformer configurations is simplified because the transformers are easily replicated as printed circuits.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A radio frequency transformer board comprising:
a planar dielectric substrate having a first surface and an opposite, second surface;
an unbalanced transformer comprising a first elongate conductor disposed on said first surface and having a first end and a second end, a second elongate conductor disposed on said second surface and having a first end and a second end, said first end of said first conductor and said second end of said second conductor disposed proximate one edge of said substrate and spaced apart from one another in a plane of said substrate; and
an electrical short joining said second end of said first conductor and said first end of said second conductor proximate said edge of said substrate.

2. The radio frequency transformer board in accordance with claim 1 wherein said electrical short comprises a conductor passing through a hole of said planar dielectric substrate.

3. The radio frequency transformer board in accordance with claim 2 wherein said electrical short comprises a plated through hole.

4. The radio frequency transformer board in accordance with claim 1 wherein the shapes of said first conductor and said second conductor are the same.

5. The radio frequency transformer board in accordance with claim 1 having a toroid passing through said substrate and surrounding both said first elongate conductor and said second elongate conductor.

6. A plurality of radio frequency transformer boards in accordance with claim 1 interconnected to provide an impedance ratio of $n^2$:1, where a is an integer greater than 1.

7. The radio frequency transformer board in accordance with claim 1 utilized in a circuit operating at a frequency f wherein said first elongate conductor and said second elongate conductor each have length $$\frac{\lambda}{4n}$$

measured curvilinearly, where λ is a wavelength at frequency f and n is an integer.

8. The radio frequency transformer board in accordance with claim 7 having a resistor electrically coupled thereto and configured to operate in a radio frequency circuit as a zero degree hybrid transformer at frequency f.

9. The radio frequency transformer board in accordance with claim 8 having two input ports of impedance Z0 each having the same phase and shunted together by a resistance having a value of Z0×2 ohms and a common port having an impedance of Z0/2 ohms.

10. The radio frequency transformer board in accordance with claim 7 configured to operate in a radio frequency circuit as an unbalanced autotransformer.

11. A transformer assembly comprising a radio frequency transformer board in accordance with claim 1 mounted perpendicularly to a surface of a planar RF circuit board having a plurality of electrical contacts disposed thereon, wherein said first end of said first elongate conductor, said first end of said second elongate conductor, and said electrically joined second ends are electrically coupled to said electrical contacts.

12. The transformer assembly in accordance with claim 11 having a plurality of electrical components also mounted on said surface of said planar RF circuit board.

13. The transformer assembly in accordance with claim 12 wherein said plurality of electrical components includes a push-pull amplifier, and said radio frequency transformer board is configured as a splitter between an RF source and an input of the push-pull amplifier.

14. A transformer assembly in accordance with claim 13 wherein said radio frequency transformer board has an impedance ratio of $n^2$:1, where n is an integer greater than 1.

15. The transformer assembly in accordance with claim 12 wherein said plurality of electrical components includes at least two RF amplifiers, and said radio frequency transformer board is configured as a combiner between said at least two RF amplifiers and an RF output.

16. The transformer assembly in accordance with claim 15 wherein said radio frequency transformer board has an impedance ratio of $n^2$:1, where n is an integer greater than 1.

17. A radio frequency transformer board having a planar dielectric substrate having a first surface, an opposite second surface, and a transformer, said transformer including a first elongate conductor disposed on the first surface and having a first end and a second end, and a second elongate conductor disposed on the second surface and having a first end and a second end, wherein the first end of the first conductor and the second end of the first conductor are spaced apart from one another proximate an edge of the substrate, and the first end of the second conductor and the second end of the second conductor are spaced apart from one another at the same edge of the substrate.

18. The transformer board in accordance with claim 17 wherein the first conductor and the second conductor have mirror-image shapes as viewed from opposite surfaces of the substrate, and are positioned on the opposite surfaces so as to essentially coincide with one another on opposite surfaces of the substrate.

19. The transformer board in accordance with claim 17 configured as a 1:1 balance/unbalance transformer.

20. A plurality of transformer board in accordance with claim 17 interconnected to provide a transformation ratio of $n^2$:1, where n is an integer greater than 1.

* * * * *

UNITED STATES PATENT AND TRADEMARK OFFICE
CERTIFICATE OF CORRECTION

PATENT NO. : 6,765,469 B2  
DATED : July 20, 2004  
INVENTOR(S) : John E. Sortor It is certified that error appears in the above-identified patent and that said Letters Patent is hereby corrected as shown below:

Column 10,
Line 33, "a" should be -- n --.

Signed and Sealed this

Eleventh Day of April, 2006

JON W. DUDAS  
*Director of the United States Patent and Trademark Office*